(12) United States Patent
Wikus et al.

(10) Patent No.: US 9,766,311 B2
(45) Date of Patent: Sep. 19, 2017

(54) CRYOSTAT WITH MAGNET ARRANGEMENT WHICH INCLUDES AN LTS PORTION AND AN HTS PORTION

(71) Applicant: Bruker BioSpin GmbH, Rheinstetten (DE)

(72) Inventors: Patrick Wikus, Nürensdorf (CH); Wolfgang Frantz, Karlsruhe (DE)

( * ) Notice: Subject to any disclaimer, the term of this patent is extended or adjusted under 35 U.S.C. 154(b) by 0 days.

(21) Appl. No.: 15/267,667

(22) Filed: Sep. 16, 2016

(65) Prior Publication Data

US 2017/0082707 A1 Mar. 23, 2017

(30) Foreign Application Priority Data

Sep. 18, 2015 (DE) ................. 10 2015 218 019

(51) Int. Cl.
*H03K 17/80* (2006.01)
*G01R 33/38* (2006.01)
*G01R 33/3815* (2006.01)
*H03K 17/92* (2006.01)
*H01F 6/00* (2006.01)

(52) U.S. Cl.
CPC ..... *G01R 33/3804* (2013.01); *G01R 33/3815* (2013.01); *H01F 6/00* (2013.01); *H03K 17/92* (2013.01)

(58) Field of Classification Search
None
See application file for complete search history.

(56) References Cited

U.S. PATENT DOCUMENTS 6,489,769 B2 12/2002 Nakamura et al.
6,545,474 B2 4/2003 Nakamura et al.
(Continued)

FOREIGN PATENT DOCUMENTS

CN 101577165 A 11/2009
DE 100 33 869 A1 1/2002
(Continued)

OTHER PUBLICATIONS

Maher et al., Multi-layer coated conductor cylinders—an alternative approach to superconducting coil fabrication, Supercond. Sci. Technol. 17 (2004) 1440-1445.
(Continued)

*Primary Examiner* — Lincoln Donovan
*Assistant Examiner* — Khareem E Almo
(74) *Attorney, Agent, or Firm* — Benoit & Cote, Inc.

(57) ABSTRACT

A cryostat includes a magnet arrangement for the generation of a magnetic field B0, the magnet arrangement comprising an LTS portion having at least one LTS section made from a conventional low-temperature superconductor and an HTS portion having at least one HTS section made from a high-temperature superconductor. The HTS portion is arranged radially within the LTS portion, and the cryostat is designed to control the temperature of the LTS portion and the HTS portion independently of one another, wherein the HTS portion is electrically isolated from the LTS portion, and is designed to be superconductingly short-circuited. The invention proposes a cryostat with magnet arrangement which enables a high magnetic field strength in a compact space and, at the same time, can be easily constructed.

20 Claims, 12 Drawing Sheets

(56) References Cited

U.S. PATENT DOCUMENTS

| | | | |
|---|---|---|---|
| 6,762,664 B2 | 7/2004 | Sander | |
| 7,002,341 B2* | 2/2006 | Baudenbacher | G01R 33/0354 324/248 |
| 7,982,566 B2 | 7/2011 | Kasten | |
| 8,061,016 B2 | 11/2011 | Maher | |
| 8,255,022 B2 | 8/2012 | Schneider et al. | |
| 8,255,023 B2 | 8/2012 | Schlenga et al. | |
| 8,712,489 B2 | 4/2014 | Schauwecker et al. | |
| 8,989,828 B2* | 3/2015 | Nakagawa | H01F 6/06 505/163 |
| 2008/0204016 A1* | 8/2008 | McDougall | G01R 33/3808 324/309 |
| 2008/0278166 A1* | 11/2008 | Wosik | G01R 33/34007 324/318 |
| 2009/0045895 A1 | 2/2009 | Kasten | |
| 2009/0233797 A1 | 9/2009 | Schlenga et al. | |
| 2009/0291850 A1* | 11/2009 | Schneider | H01F 6/04 505/162 |
| 2010/0231215 A1* | 9/2010 | Ma | G01R 33/3403 324/307 |
| 2010/0267567 A1* | 10/2010 | Overweg | G01R 33/3815 505/163 |
| 2012/0065073 A1* | 3/2012 | Maher | H01F 41/048 505/162 |
| 2013/0102472 A1 | 4/2013 | Iwasa | |
| 2015/0084633 A1* | 3/2015 | Garside | F25B 9/14 324/322 |
| 2015/0332829 A1* | 11/2015 | Stautner | H01F 6/04 505/162 |
| 2016/0139221 A1* | 5/2016 | Overweg | G01R 33/3815 324/322 |
| 2016/0216347 A1* | 7/2016 | Roth | G01R 33/3815 |
| 2016/0216348 A1* | 7/2016 | Roth | G01R 33/3815 |
| 2017/0052235 A1* | 2/2017 | Mohebbi | G01R 33/34076 |

FOREIGN PATENT DOCUMENTS

| | | | | |
|---|---|---|---|---|
| DE | WO 2007107238 A1 * | 9/2007 | | G01R 33/3815 |
| DE | WO 2007107240 A1 * | 9/2007 | | G01R 33/3815 |
| DE | 10 2006 012 508 B3 | 10/2007 | | |
| DE | 10 2006 012 509 B3 | 10/2007 | | |
| DE | 10 2006 012 511 B3 | 11/2007 | | |
| DE | 10 2011 082 652 A1 | 3/2013 | | |
| EP | 1 604 377 B1 | 10/2009 | | |
| GB | 2411477 A | 8/2005 | | |
| GB | 2506276 A | 3/2014 | | |
| JP | 3737895 B2 | 5/2000 | | |

OTHER PUBLICATIONS

Kim et al., Study on Trapped Field Characteristics of HTS Bulk Annuli With Iron Rings for Ferromagnetic Shimming of a Compact NMR Magnet, IEEE Transactions on Applied Superconductivity, vol. 19, No. 3, Jun. 2009, 2273-2276.

* cited by examiner

CRYOSTAT WITH MAGNET ARRANGEMENT WHICH INCLUDES AN LTS PORTION AND AN HTS PORTION

BACKGROUND OF THE INVENTION

Field of the Invention

The invention relates to a cryostat having a magnet arrangement for the generation of a magnetic field B0, wherein the magnet arrangement comprises a low-temperature superconductor (LTS) portion having at least one LTS section made from a conventional low-temperature superconductor and a high-temperature superconductor (HTS) portion having at least one HTS section made from a high-temperature superconductor, wherein the HTS portion is arranged radially within the LTS portion, and wherein the cryostat is designed to control the temperature of the LTS portion and the HTS portion independently of one another. Such a cryostat has been disclosed in DE 10 2006 012 508 B3.

Description of the Related Art

Nuclear magnetic resonance (=NMR) spectroscopy is a powerful method of instrumental analysis which is based on the alignment of nuclear spins in a strong magnetic field and their behavior when radiated with high-frequency pulses. NMR magnets based on superconducting coils are normally used to generate particularly high magnetic field strengths which are required for high spectral resolutions.

Conventional NMR magnets are normally produced from low-temperature superconductor (=LTS) wires, in particular NbTi or Nb3Sn wires. As a result of the critical field of Nb3Sn, there is currently an upper limit of approximately 23.5 T for the achievable magnetic field strength which, in NMR, corresponds to a proton resonance frequency of 1000 MHz.

In order to achieve higher field strengths or to enable a magnet with a given field strength to be made more compact, alternative conductor materials must be called upon. In this context, research is mainly carried out into the use of high-temperature superconductor (=HTS) tape conductors, in particular based on YBCO. Coils in the form of a solenoid are normally wound with the HTS tape conductors.

In doing so, the NMR magnet is not made entirely from HTS materials; for cost reasons, it is advantageous to draw upon HTS only for the innermost sections and produce the background magnet in conventional LTS technology based on NbTi or Nb3Sn. Normally, a magnet section is wound from HTS tape material and then connected electrically in series with an LTS background magnet. For example, cryostats having magnetic coil systems in which, in each case, at least one inner HTS section is connected in series with at least one outer LTS section, are described in DE 10 2006 012 508 B3, DE 10 2006 012 509 B3 and in DE 10 2006 012 511 B3.

HTS tape conductors can only be produced in limited lengths so that, as a rule, superconducting or at least very low resistance connecting points (joints) of HTS to HTS are required for a typical NMR magnetic coil, which is technologically difficult. Likewise, in the known magnetic coil systems, superconducting or at least very low resistance connecting points (joints) from LTS to HTS must be produced, which is likewise technologically difficult. In general, a location with low magnetic field strength must be chosen for the joints, which often makes complex conductor routing necessary. Furthermore, as a rule, tape conductors have varying properties over the cross section, which leads to inhomogeneities in the generated magnetic field. Likewise, shielding currents in the tape conductors can lead to inhomogeneities over the width of the tape.

HTS coils which are not based on wound tape conductors are also known from the prior art.

DE 100 33 869 A1 describes a system of HTS rings which are charged by means of current pulses via connecting pieces of the rings which are positioned closely together in the circumferential direction or by magnetic pulses from a normal conducting copper coil.

U.S. Pat. No. 6,489,769 B2 describes an HTS magnet having a hollow, cylindrical form which is magnetized at a first, low temperature and subsequently heated to a second, higher temperature which, however, lies below the transition temperature of the HTS; here, no liquid helium is required to generate a strong, static magnetic field. A similar procedure is also described in U.S. Pat. No. 6,545,474 B2.

U.S. 8,061,016 B2 describes a method for fabricating an HTS coil by depositing, shaping and texturing individual coil windings on a curved former. Multi-layer coated cylinders as an alternative method for the fabrication of superconducting coils are described in Maher et al., Supercond. Sci. Tech. 17 (2004), 1440-1445. A method for determining a suitable conductor path in a thin film on a curved former for a superconducting coil has been disclosed in EP 1 604 377 B1.

Kim et al., IEEE TRANSACTIONS ON APPLIED SUPERCONDUCTIVITY, Vol. 19, No. 3, June 2009, Pages 2273-2276, have proposed charging HTS rings made from solid material in an outer energization magnet and subsequently removing the HTS rings for further use. The HTS rings are cooled with $LN_2$ or helium.

DE 10 2006 012 508 B3 describes a cryostat having a magnetic coil system which is located in a tank with liquid helium. A chamber is installed around the HTS section(s) of the magnetic coil system so that the HTS section(s) are separated from the LTS sections. Liquid helium is contained in the helium tank, whereas the helium remains gaseous in the chamber. The inside of the chamber can be heated with an electrical heater. The LTS sections and the HTS section(s) are electrically connected in series with one another.

A helium-tight bushing through the wall of the chamber is necessary for the serial connection of the LTS sections and the HTS section(s), which is technologically difficult to install. In addition, with this cryostat, a permanent temperature difference exists between chamber and remaining helium tank in operation, which requires a continuously high cooling power and is associated with a high helium consumption.

SUMMARY OF THE INVENTION

The invention is based on the object of proposing a cryostat with magnetic coil system which enables a high magnetic field strength in a compact space and, at the same time, can be easily constructed. This object is achieved in a surprisingly simple manner by a cryostat of the kind mentioned in the introduction which is characterized in that the HTS portion is electrically isolated from the LTS portion, and that the HTS portion is designed to be superconductingly short-circuited.

Within the frame of the present invention, it is provided to charge the HTS portion inductively via the LTS portion; for this purpose (and also for charging the LTS portion itself), the LTS portion has current feed lines to a power supply or also to a plurality of power supplies. The LTS portion and the HTS portion can then be electrically isolated from one another; no bushings and no joints from the LTS portion to the HTS portion are installed. Likewise, it is unnecessary to install current feeds to the HTS portion. This enables a particularly simple and compact structure to be achieved.

In general, the HTS portion is permanently superconductingly short-circuited (as long as the HTS portion overall is superconducting at an adequately low-temperature), thus enabling the HTS portion to carry an induced current in "persistent mode". In doing so, individual HTS sections or also a plurality of series-connected sections can be superconductingly short-circuited together, or the conductor structures (such as individual HTS rings) of an HTS section can be superconductingly short-circuited individually or in groups. Superconductingly closed structures which are less susceptible to faults and are easier to handle than, for example, jointed, wound HTS tape conductors, and also can often constitute a higher current carrying capability, can be used for an HTS section which is permanently superconductingly short-circuited.

At the same time, the inductive charging of the HTS portion can be carried out by means of a suitable current loading of the LTS portion or of individual sections of the LTS portion, and a transfer of the current to the HTS portion by suitable control of the temperature of the HTS portion (temporarily differing from the LTS portion). Here, in particular, the temperature of the HTS portion is changed from above the transition temperature $T_{c,HTS}$ of the HTS to below $T_{c,HTS}$, whereas the temperature of the LTS portion usually remains constant below the transition temperature $T_{c,LTS}$ of the LTS. As the HTS portion is arranged radially within the LTS portion, a substantial increase in the magnetic field strength in the test volume in the room temperature bore can be achieved when magnetic flux is transferred to the HTS portion. Preferably, in cross section (perpendicular to the direction of the B0 field), the LTS portion encompasses an area which is a factor of two or more greater than the HTS portion.

As a rule, the cryostat has at least one helium tank (for the LTS portion or also for the whole magnet arrangement), and furthermore an outer tank or radiation shield which is cooled, for example, by liquid nitrogen (=$LN_2$). Typically, the cryostat has a common outer structure (housing structure), for example a vacuum container wall, within which the LTS portion and the HTS portion are permanently arranged. In a preferred design of the cryostat, the magnetic field $B_0$ is generated in a test volume in a room temperature bore of the cryostat. In particular, the cryostat can be part on an NMR spectrometer in order to measure a sample in the test volume by means of NMR spectroscopy.

In an LTS section, winding is typically carried out with $Nb_3Sn$ wire or NbTi wire in the form of a solenoid. YBCO material is typically incorporated in an HTS section, typically in the form of a tape conductor or preferably as closed annular coating(s) on a cylindrical support body.

The cryostat typically has an electrical heater for the HTS portion with which the HTS portion can be heated quickly (and independently of the LTS portion), in particular above the transition temperature $T_{c,HTS}$ of the HTS portion.

Within the frame of the invention, materials, preferably those with a transition temperature of 40 K or more, in particular YBCO and BSCCO, can be used as HTS materials. Materials, preferably those with a transition temperature of 30 K or less, in particular NbTi and $Nb_3Sn$, can be used as LTS materials.

In a preferred embodiment of the cryostat according to the invention, the HTS portion is designed without current feed lines. This greatly simplifies the structure of the cryostat. As the HTS portion is inductively charged, current feed lines to an external power supply for applying current are superfluous. In particular, the cryostat is easier to insulate thermally.

Also preferred is an embodiment in which the LTS portion can be short-circuited by means of one or more superconducting switches. This enables operation in "persistent mode" to take place on completion of the charging process without connected power supplies. The LTS sections (when there are a plurality thereof) can be short-circuited all together, or individually, or also in groups, in each case by means of a superconducting switch.

Advantageously, an embodiment provides that at least one HTS section comprises a closed superconducting cylindrical sleeve or a closed superconducting ring or a plurality of closed superconducting rings in a radial layer, in particular wherein the cylindrical sleeve or ring or rings are deposited on a cylindrical support body. Closed cylindrical sleeve structures and closed annular structures are relatively easy to manufacture, wherein there is no risk of a residual ohmic resistance as no joints are required. Accordingly, the drift is small in normal operation. A plurality of (electrically separate) rings in a radial layer avoids larger, contiguous superconducting areas for shielding currents. A support body mechanically stabilizes the HTS section and can also support large material thicknesses, thus also enabling large currents to be carried. In particular, the support body can be made from Hastelloy. In particular, large forces resulting from axial pressure and hoop stresses which act on the current-carrying HTS paths can be absorbed.

In a preferred development of this embodiment a plurality of radial layers with, in each case, a closed superconducting cylindrical sleeve or a closed superconducting ring or a plurality of radial layers with, in each case, a plurality of closed superconducting rings are provided, in particular wherein the radial layers are deposited on a cylindrical support body. As a result of the plurality of radial layers, the current loading of an individual radial layer is reduced for the same contribution to the field of the HTS section. For one layer of a plurality of rings, YBCO material can be deposited on a support body and structured in the form of a ring using a laser. $SrTiO_3$ can be arranged as an insulation material between the layers (and the rings in the layers). In particular, known deposition and structuring methods from U.S. Pat. No. 8,061,016 B2 and EP 1,604,377 B1 can be used to produce the HTS section.

In another embodiment, at least one HTS section comprises a coil section which is wound in the form of a solenoid with a tape conductor and is superconductingly short-circuited. A coil section wound in the form of a solenoid with tape conductors can generate large magnetic field strengths with comparatively small volume determined by the high current carrying capacity of the HTS material. Preferably, a tape conductor which, with the exception of the two end regions, is slotted in the longitudinal direction, is used to wind the coil section. If at least one HTS-HTS joint has to be constituted for an embodiment, this is preferably carried out by overlapping the tape conductor ends to be connected over a large length (e.g., 5 m or longer), in particular wherein the overlapping region is wound in the manner of a pancake coil.

Particularly advantageous is an embodiment in which the LTS portion comprises at least two LTS sections, in particular an LTS main section and an LTS shield section. A plurality of LTS sections enables the generated magnetic field to be optimized, in particular with regard to avoiding or minimizing a stray field in the outer region and/or with regard to the homogeneity in the test volume. For its part, an LTS section can comprise a plurality of LTS sub-sections which are connected electrically in series. Preferably, the at least two LTS sections are connected superconductingly electrically in series or can be connected superconductingly electrically in series by one or more superconducting switches.

In a particularly preferred development of this embodiment, the magnet arrangement has a plurality of charging connections and/or superconducting switches and/or power supplies with which the at least two LTS sections can be charged with electrical current and discharged independently of one another. This enables the charging process to be optimized, and also the generated magnetic field can be further optimized due to different currents in the individual LTS sections. Preferably, in an LTS shield section, charging is possible with a different current direction.

Particularly advantageous is a development in which the at least two LTS sections in each case generate a different magnetic field characteristic, in particular wherein one of the LTS sections has a notch. This enables the homogeneity of the magnetic field generated in the test volume to be optimized. Preferably, the magnet arrangement can generate a homogeneity of 10 ppm or better, preferably 1 ppm or better, in the test volume which typically encompasses at least 10 cm$^3$.

In a preferred embodiment, it is provided that the cryostat comprises a first, outer helium tank for the LTS portion and forms a second, inner helium tank for the HTS portion. This enables different temperature control of the HTS portion and the LTS portion to be carried out easily, in particular wherein helium with (at least temporarily) different temperature and, if necessary, different aggregate state is contained in the two helium tanks. The first and second helium tank can be connected by means of a valve, preferably wherein the second helium tank has a separate discharge line for helium.

Preferred is a development of this embodiment in which a radiation shield, in particular an $LN_2$-cooled radiation shield, is arranged between the first helium tank and the second helium tank. This enables the heat introduced into the cooler helium tank (during charging, usually the first helium tank) to be kept low and therefore the required cooling power to be reduced or the helium consumption decreased.

In another, advantageous embodiment, it is provided that the cryostat for the LTS portion forms a helium tank, that the HTS portion is arranged in a vacuum chamber which also contains the helium tank, and that the HTS portion can be thermally coupled to the helium tank and decoupled from the helium tank by means of a heat switch, in particular wherein the heat switch is of the gas gap heat switch type. This structure is comparatively easy to constitute. This design is well-suited particularly when the temperature of HTS portion and LTS portion is to be equal, usually at 4.2 K, during normal operation (after charging).

A method for charging the magnet arrangement of a cryostat according to the invention and described above having the following steps also falls within the framework of the present invention:
a) the LTS portion is cooled below the transition temperature $T_{c,LTS}$ and the HTS portion is held above its transition temperature $T_{c,HTS}$;
b) at least one first LTS section is charged to an interim current $I_{IN}$, wherein the interim current $I_{IN}$ differs from a first operating current $I_{B^1}$;
c) the HTS portion is cooled below its transition temperature $T_{c,HTS}$;
d) the current $I_{LTS^1}$ in the at least one first LTS section is changed to the first operating current $I_{B^1}$, as a result of which the HTS portion is inductively charged.

With the charging method according to the invention, the magnet arrangement can be charged without external current feed lines (charging connections) of the HTS portion and without electrical connections of the HTS proportion to the LTS portion. This enables a simple and compact structure of the cryostat or magnet arrangement. As part of Step b), the at least one first LTS section is brought to an interim current $I_{IN}$ which differs from the later operating current $I_{B^1}$. In doing so, the HTS portion does not yet charge (at least not noticeably), as the HTS portion is still normally conducting. Only after Step c) is the HTS portion superconducting and can accept current, which it does as part of Step d) in order to maintain the total magnetic flux. Here, the difference of the first operating current $I_{B^1}$ and (first) interim current $I_{IN}$ is used to charge the HTS portion. It is to be noted that, within the framework of the invention, one or more further LTS sections can also be supplied with their own interim current $I_{IN}^W$ in Step b) and changed to their own operating current $I_{B^W}$ in Step d). For example, in Step a) the LTS portion can be cooled to 4.2 K or less and, for example, the HTS portion held at 90 K or more. It is also to be noted that, depending on the HTS material, the temperature THTS of the HTS portion can, for example, also lie at 100 K or more. For example, in Step c), the HTS portion can be cooled to 4.2 K or less.

A preferred variant of the method according to the invention provides that, during Step b), the LTS portion overall is charged with the same interim current $I_{IN}$ and, during Step d), the LTS portion overall is changed to the same first operating current $I_{B^1}$. This variant can be realized particularly easily; in particular, only one power supply is required to charge the LTS portion. As a rule, in this variant, the LTS portion is operated in "overcurrent" mode in Step b). Here, the whole LTS portion is used to charge the HTS portion.

A preferred, alternative variant provides that, in Step b), at least one second LTS section is in turn charged to a second operating current $I_{B^2}$, and that, in Step c) and d), the current $I_{LTS^2}$ of the at least one second LTS section is held at the second operating current $I_{B^2}$. Within the framework of this variant, the LTS portion is divided into (at least) two. In Step b), the first LTS sections receive the interim current $I_{IN}$ with a first power supply, and the second LTS sections the second operating current $I_{B^2}$ with a second power supply. In Step d), the current is then changed from $I_{IN}$ to $I_{B^1}$ with the first power supply, and the current $I_{B^2}$ is maintained with the second power supply. The same current therefore does not flow through the at least one first LTS section and the at least one second LTS section at least during Steps b), c) and d). Here, only one part of the LTS portion is used to charge the HTS section. If only the HTS section and the at least one first LTS section participate in the current redistribution in Step d), this simplifies the charging process and makes it easy to predict.

A further development in this regard, wherein the operating currents $I_{B^1}$ and $I_{B^2}$ are chosen to be different, is advantageous. This enables the generated B0 field to be optimized, in particular with regard to the homogeneity in the test volume.

Another, preferred further development provides that the at least one first LTS section comprises an LTS shield section of the magnet arrangement, and that, in Step b), the interim current $I_{IN}$ has the opposite sign to the first operating current $I_{B^1}$ in Step d). An LTS shield section couples to the HTS section with negative coupling inductance. As a result of the interim current $I_{IN}$ in the LTS shield section, the stray field of the magnet arrangement initially increases, and the magnetic field B0 in the bore or in the test volume increases slightly. When the current in the LTS shield section is reduced and inverted, the magnetic field B0 increases further, now due to the redistribution of the magnetic flux from the LTS shield section into the radially smaller HTS section (s). As a rule here, the at least one first LTS section includes only LTS shield section(s). It is to be noted that, in this further development, the magnitude of the interim current $I_{IN}$ can be greater than the first operating current $I_{B^1}$; however a critical current of the at least one first LTS section must not be exceeded. Furthermore, it must be ensured that the other LTS sections are not brought into a critical range due to the interim current $I_{IN}$ in the shield section and the associated increase in the field. Reversing the sign of the current of the first LTS section(s) enables a particularly large current to be transferred to the HTS portion.

In an alternative further development, it is provided that the magnitude of the interim current $I_{IN}$ is greater than the first operating current $I_{B^1}$, and, in Step d), the magnitude of the current $I_{LTS^1}$ is reduced to the first operating current $I_{B^1}$ without changing the sign of the current $I_{LTS^1}$. In this case, the at least one LTS section is operated in "overcurrent" mode which, as a rule, is not problematic outside normal operation at interim currents which are not too high (e.g., maximum two times as high as the operating current). However, a critical current of the at least one first LTS section must not be exceeded. With this further development, LTS sections with positive coupling inductance to the HTS portion can be used to charge the HTS portion.

A variant, in which after Step c) the LTS portion and the HTS portion are held at substantially the same temperature, in particular wherein this temperature is 4.2 K or less, is advantageous. If no temperature gradients are actively maintained between LTS portion and HTS portion, the cooling power can be used particularly efficiently. In particular, a low helium consumption can be achieved. At 4.2 K (corresponding to the boiling point of helium at normal pressure) or less, the HTS portion has a particularly high current carrying capacity. The substantially equal temperature of LTS portion and HTS portion is typically maintained not only for the rest of the charging process but also for the subsequent normal operation (for example during NMR or MRI measurements).

In a particularly preferred variant, the LTS portion is in turn superconductingly short-circuited in a Step e). The LTS portion is operated in a "persistent mode", and power supplies are no longer required. In Step e), the LTS sections (when there are a plurality thereof) are short-circuited all together (common), or individually, or also in groups, in each case by means of a superconducting switch.

Further advantages of the invention can be seen from the description and the drawing. Likewise, according to the invention, the characteristics stated above and the characteristics explained further can in each case be applied individually in their own right or jointly in any combination. The embodiments shown and described are not to be understood as a conclusive list, but rather they have an exemplary character for illustrating the invention.

BRIEF DESCRIPTION OF THE DRAWINGS

The invention is shown in the drawings and is explained in more detail with reference to exemplary embodiments. In the drawings.

DETAILED DESCRIPTION

A basic idea of the present invention is, in the case of a magnet arrangement of a cryostat, in particular in the case of an NMR magnet, to arrange the HTS section or the HTS sections (overall "HTS portion", also "HTS coil") electrically and thermally insulated from the LTS section or the LTS sections (overall "LTS portion", also "background magnet" or "LTS coil"). Furthermore, the cryostat is designed to charge the HTS section(s) inductively via the LTS section(s). Means for the inductive charging of the HTS section(s) can be provided for this purpose. To this end, in some embodiments, the facility is provided of charging an LTS shield coil optionally with or in opposition to an LTS main coil.

Furthermore, according to the invention, the HTS coil or HTS section can be made from tape material, or also (preferably) designed as an arrangement of one or more superconducting rings or cylinders in which a current is introduced inductively during the charging process.

In addition, a method for inductively charging the HTS coil is described, in which, on the one hand, the LTS coil or the LTS main section is operated in "overcurrent" mode at different temperatures of LTS and HTS portion. Alternatively, for the charging process, the LTS shield section for the charging process is charged so that the B0 component of the magnetic field in the bore of the cryostat is intensified and the stray field is increased. Subsequently, the HTS coil is cooled below the transition temperature, and the magnetic field of the outer LTS section(s) is reduced and current is passed through the LTS shield section such that the stray field is reduced.

Within the framework of the invention, the temperature of the HTS coil, which is located, for example, in a separate helium tank from the LTS coil, is generally changed only for the charging process; superconductivity in the HTS is switched off and on by increasing and reducing the temperature above/below the transition temperature (critical temperature) of the HTS. For this reason, the temperature change also takes place in a comparatively large frame. As a rule, the temperature of the HTS coil must be controlled between approx. 4 K (or also 2 K) and approx. 100 K which can make structural differences (e.g. additional radiation shields) compared with conventional cryostats necessary or at least advantageous.

Basic Types of Cryostats and Charging Process

Figure 1:
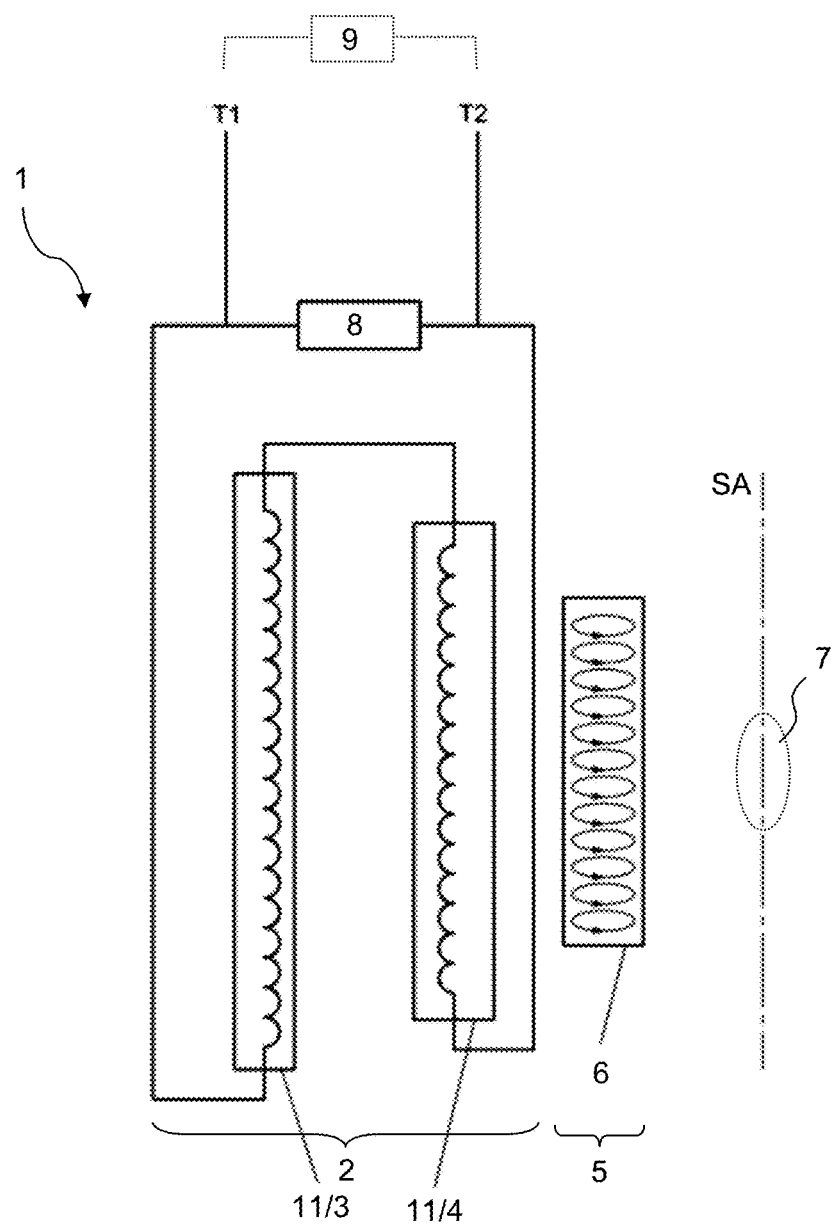
FIG. 1 shows a schematic diagram of the magnet arrangement of a first embodiment of a cryostat according to the invention with entirely serially connected LTS portion.

FIG. 1 shows a first embodiment of a magnet arrangement 1 of a cryostat according to the invention. The magnet arrangement 1 comprises an LTS portion (background magnet, LTS coil) 2, here with two (first) LTS sections 11, namely an outer LTS shield section (shield coil) 3 and an inner LTS main section (main coil) 4, and an HTS portion (HTS coil) 5, here comprising an HTS section 6, namely a superconductingly closed cylindrical sleeve. It is to be noted that, in practice, the sections 3, 4 and/or 6 can in each case also consist of serially connected sub-coil sections.

The magnet arrangement 1 is designed to be substantially rotationally symmetrical with regard to a coil axis SA, wherein, for simplification, only the left-hand part of the section of the magnet arrangement 1 is shown in FIG. 1 (also applies to subsequent figures).

The LTS portion 2 radially encompasses the HTS portion 5. In normal operation, by means of the magnet arrangement 1, a homogenous magnetic field B0, in which NMR and/or MRI measurements can take place, is generated in the direction of the coil axis SA in a test volume 7, through which the coil axis SA runs centrally. The test volume 7 lies in the room temperature bore of the cryostat. The homogeneity in the test volume 7 is typically 10 ppm or better.

In the embodiment shown, the two (first) LTS sections 11 or 3, 4 respectively are connected electrically superconductingly in series and current can pass through them collectively via the external current feed lines (charging connections) T1, T2 from a power supply 9, wherein the current flowing through the current feed lines T1, T2 can be controlled and in particular varied with the power supply 9. Between the charging connections T1, T2, the LTS portion 2 as a whole can be superconductingly short-circuited by means of a superconducting switch (main switch) 8.

The HTS portion 5 has no external current feed lines. The closed cylindrical sleeve of the HTS section 6 is always superconductingly short-circuited (assuming an adequately low-temperature) so that circulating currents around the coil axis SA are possible.

As the HTS portion (the HTS coil) 5 has no direct electrical connection to the LTS portion (the background magnet) 2 and also has no "persistent switch", the HTS coil 5 must be charged inductively. Such a charging process is described by way of example in the following:

- The background magnet 2 is cooled and charged while the HTS coil 5 is still held above its transition temperature $T_{c,HTS}$.
- The background magnet 2 is "overcharged", i.e. a current which lies above the nominal operating current $I_{B^1}$ is set. This is possible with NMR magnets as, in general, the operating current $I_{B^1}$ is chosen to be very much lower than the critical current $I_c$ in order to keep the magnet drift small. However, this is not relevant during the charging process.
- The temperature of the HTS coil 5 is now reduced until it is superconducting.
- The current in the background magnet 2 is now reduced to the operating current $I_{B^1}$. In doing so, current is induced in the HTS coil 5. By suitable design of the magnet arrangement 1, it is possible for the magnetic field B0 in the bore to increase during this process.
- The main switch 8 is now closed ("persistent mode").

Figure 2:
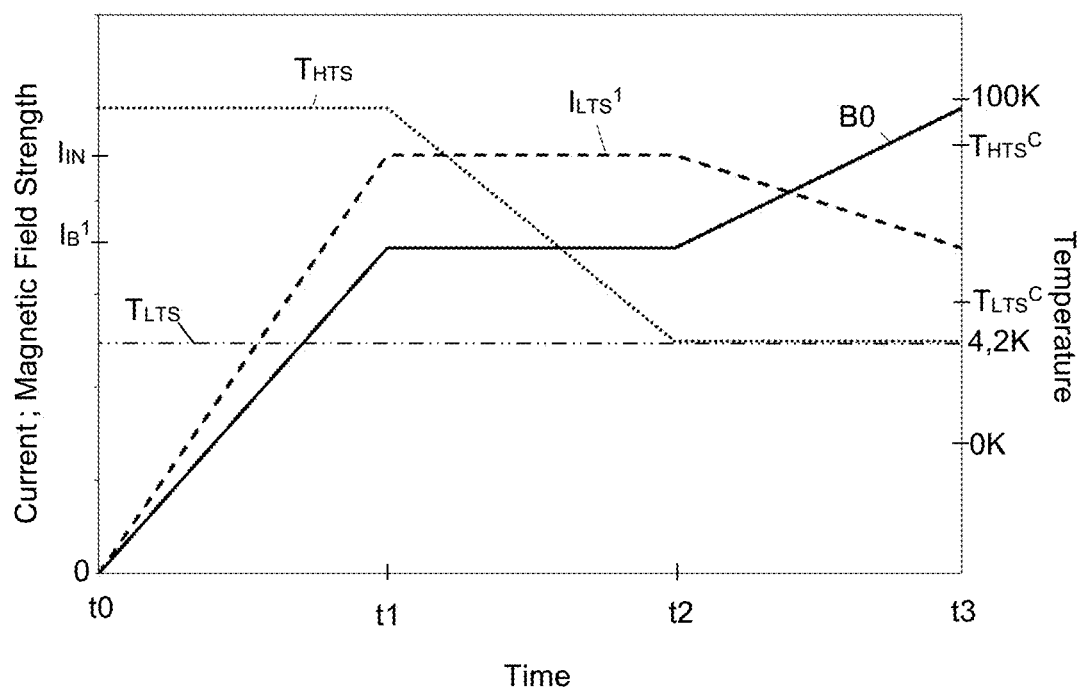
FIG. 2 shows a diagram of the characteristic parameter with respect to time of a first variant of a method according to the invention for charging the magnet arrangement of FIG. 1.

In FIG. 2 the characteristic parameter with respect to time of the current $I_{LTS^1}$ in the background magnet 2, the temperature THTS of the HTS coil 5, the temperature $T_{LTS}$ of the LTS coil 2 and the characteristic parameter with respect to time of the magnetic field B0 in the bore are in each case plotted upwards against time to the right.

In a first phase between t0 and t1 the current $I_{LTS^1}$ is brought from "zero" to an interim current $I_{IN}$ with the power supply 9 on the charging connections T1, T2. In doing so, the magnetic field B0 increases. In the meantime, the temperature $T_{LTS}$ of the LTS portion 2 is already below the (lowest) critical temperature $T_{c,LTS}$ (with NbTi approx. 10 K, with Nb$_3$Sn approx. 15 K), here at 4.2 K. The temperature THTS of the HTS portion 5 still lies above the transition temperature $T_{c,HTS}$ (with YBCO approximately 92 K), here approximately 100 K.

Between t1 and t2 the temperature $T_{HTS}$ of the HTS portion 5 is then reduced below its transition temperature $T_{c,HTS}$ here likewise to approximately 4.2 K. In doing so, the current $I_{LTS^1}$ is held constant at $I_{IN}$ with the power supply 9.

Finally, between t2 and t3, the current $I_{LTS^1}$ in the LTS portion 2 is reduced from $I_{IN}$ to $I_{B^1}$ by the power supply 9; in doing so, the sign (current direction) of the current $I_{LTS^1}$ is not changed. The magnetic flux of the LTS portion 2 is partially transferred to the radially smaller HTS coil 5, as a result of which the field strength B0 in the test volume 7 increases.

The superconducting switch 8 can then be closed and the power supply 9 can be switched off and/or removed.

Selective Charging/Discharging of Certain Sections

In the background magnet, one coil section can be charged independently of the remaining magnet. An additional current feed line, an additional power supply and an additional superconducting switch are required for this purpose.

The LTS coil section which can be charged independently can then be chosen such that the coupling with the HTS coil is optimal. It is also possible to design this LTS coil section with a notch and thereby determine the homogeneity of the magnetic field B0 in the test volume at the end of the charging process.

In particular, the LTS shield section (which is usually incorporated to reduce the stray field) is suitable for inductive charging as this couples to the HTS coil with negative coupling inductance.

Figure 3:
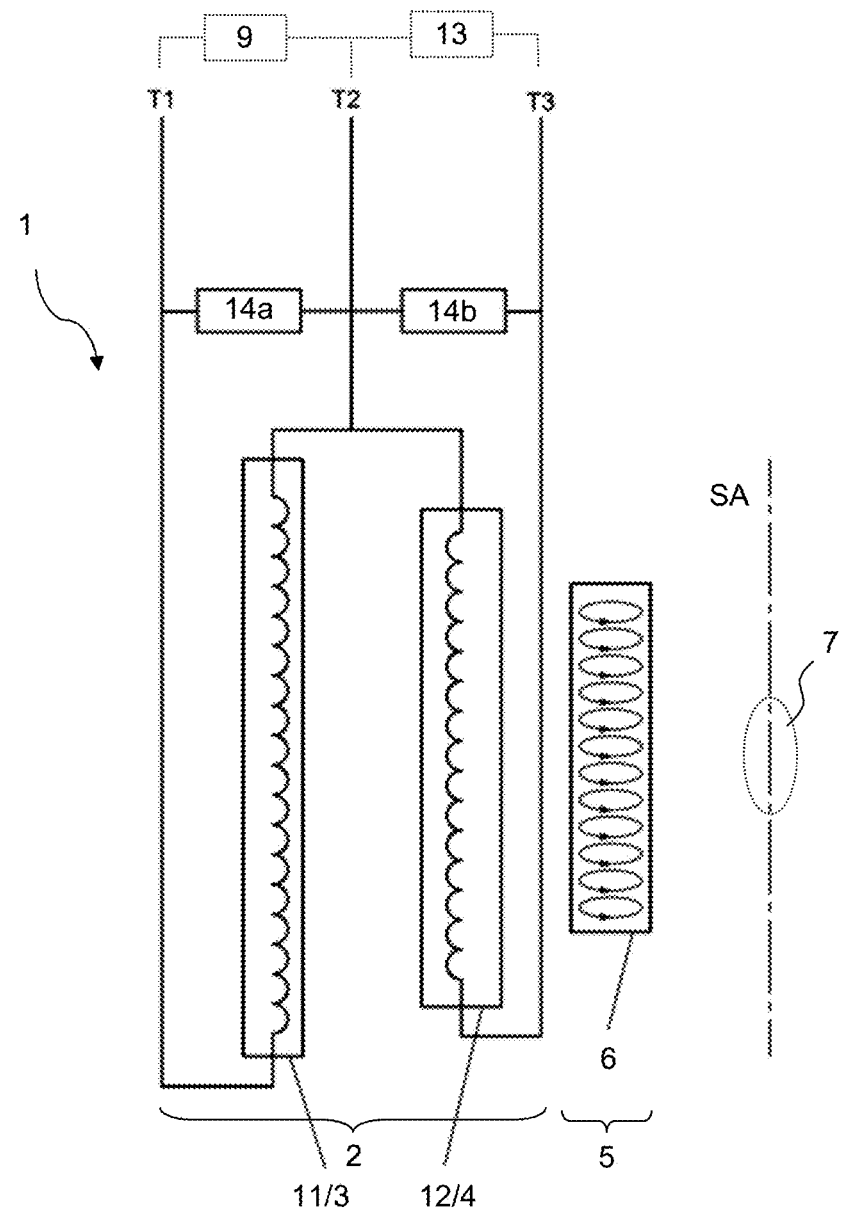
FIG. 3 shows a schematic diagram of the magnet arrangement of a second embodiment of a cryostat according to the invention having two separately chargeable and separately short-circuitable LTS sections.

FIG. 3 shows schematically a corresponding magnet arrangement 1 for a cryostat according to the invention; first and foremost, the differences from the embodiment of FIG. 1 are explained.

Here, the LTS portion 2 comprises the outer LTS shield section (shield coil) 3 as a first LTS section 11, and the inner LTS main section (main coil) 4 as a second LTS section 12; both are connected electrically in series. The first LTS section 11 can be charged via the external current feed lines T1, T2 with the power supply 9, and can be superconductingly short-circuited with the superconducting switch 14a. The second LTS section 12 can be charged via the external current feed lines T2 and T3 with a power supply 13 and can be superconductingly short-circuited by means of a superconducting switch 14b. Here, the HTS portion (HTS coil) 5 is, in turn, designed with a single HTS section 6.

Charging then takes place by way of example in accordance with the following scheme:

The background magnet 2 (consisting of main coil 4 and shield coil 3) is cooled while the HTS coil 5 is still held above $T_{c,HTS}$.

Only the main coil 4 of the background magnet 2 is charged and is held at constant current for the rest of the charging process with the power supply 13. In this step, the other power supply 9 keeps the LTS shield section 3 free from current.

The shield coil 3 is charged in the "wrong" direction, i.e. the stray field increases additionally and the magnetic field B0 in the bore increases slightly (without the field-reducing effect of the shield coil 3, the main coil 4 is overloaded; here, however, the above argument relating to the operating current applies).

The temperature THTS of the HTS coil 5 is now reduced until it is superconducting.

The LTS shield section 3 is now discharged once more and then charged in the "right" direction. In doing so, the stray field shrinks to its desired value. As a result of the negative coupling coefficient, the current in the HTS coil 5 also increases during this change of current in the LTS shield section 3. During this process, the power supply 13 maintains the main coil 4 at constant current and the magnetic field B0 in the bore increases further.

All superconducting switches 14a, 14b are now closed ("persistent mode").

Figure 4:
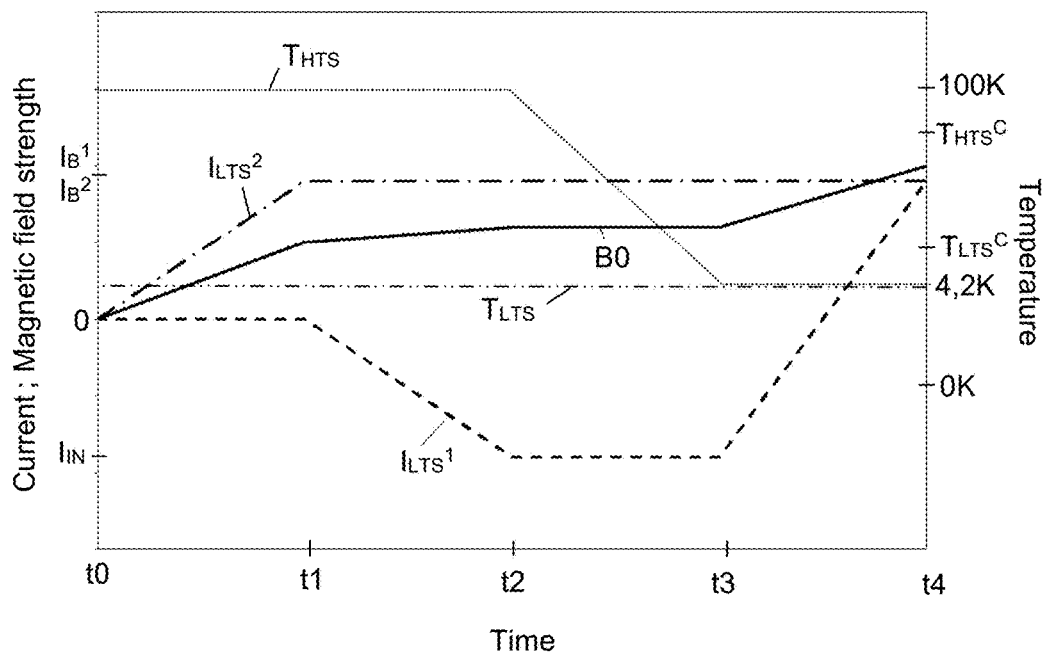
FIG. 4 shows a diagram of the characteristic parameter with respect to time of a second variant of a method according to the invention for charging the magnet arrangement of FIG. 3.

In FIG. 4 the characteristic with respect to time of the current $I_{LTS^1}$ in the first LTS section 11, of the current $I_{LTS^2}$ in the second LTS section 12, the temperature THTS of the HTS coil 5, the temperature $T_{LTS}$ of the LTS coil 2 and the characteristic with respect to time of the magnetic field B0 in the bore are in each case plotted upwards against time to the right.

In a first phase between t0 and t1 the current $I_{LTS^2}$ in the second LTS section 12, that is to say the main coil 4, is brought from "zero" to a second operating current $I_{B^2}$ with the power supply 13 at the charging connections T2, T3. In doing so, the magnetic field B0 already increases. The current $I_{LTS^1}$ in the first LTS section 11 is held at "zero" with the power supply 9. In the meantime, the temperature $T_{LTS}$ of the LTS portion 2 is already below the (lowest) critical temperature $T_{c,LTS}$ (with NbTi approx. 10 K, with Nb$_3$Sn approx. 15 K), here at 4.2 K. The temperature $T_{HTS}$ of the HTS portion 5 still lies above the transition temperature $T_{c,HTS}$ (with YBCO approximately 92 K), here approximately 100 K.

In a second phase between t1 and t2, the current $I_{LTS^1}$ in the first LTS section 11 is now brought from "zero" to the interim current $I_{IN}$ with the power supply 9. Here, this is negative, that is to say has an opposite sign from $I_{B^1}$ and $I_{B^2}$. The current $I_{LTS^2}$ is held at $I_{B^2}$ with the power supply 13. In doing so, the magnetic field B0 increases slightly, as the "negative" $I_{LTS^1}$ in the shield coil 3 acts positively on the magnetic field B0.

Between t2 and t3 the temperature $T_{HTS}$ of the HTS portion 5 is then reduced below its transition temperature $T_{c,HTS}$, here likewise to approximately 4.2 K. At the same time, the currents $I_{LTS^1}$ and $I_{LTS^2}$ are maintained constant with the power supplies 9, 13.

Finally, between t3 and t4, the current $I_{LTS^1}$ in the first LTS section 11, that is to say the LTS shield section 3, is changed from $I_{IN}$ to the positive first operating current $I_{B^1}$ by the power supply 9; in doing so, the sign (current flow direction) of the current $I_{LTS^1}$ is reversed. The magnet arrangement 1 or the power supply 9 is therefore designed to charge the LTS shield section 3 optionally with or in opposition to the LTS main section 4. In the variant shown $I_{B^1}$ is equal to $I_{B^2}$. The previous magnetic flux of the shield coil 3 is transferred to the radially smaller HTS coil 5, as a result of which the field strength B0 in the test volume 7 increases; at the same time, with the finally "positive" current $I_{LTS^1}$ in the shield coil 3, the now negative field contribution is overcompensated.

The superconducting switches 14a, 14b can then be closed and the power supplies 9, 13 can be switched off and/or removed.

Independent Temperature Control of the HTS Coil

Different possibilities exist for the independent temperature control of the HTS coil (at least when charging). In general and in particular, with all the embodiments presented in the following, it is advantageous to attach a heater to the HTS coil (or in the tank in which the HTS coil is arranged) in order to be able to raise the temperature of the HTS coil quickly or to hold it at a higher temperature level with respect to the environment.

Figure 5:
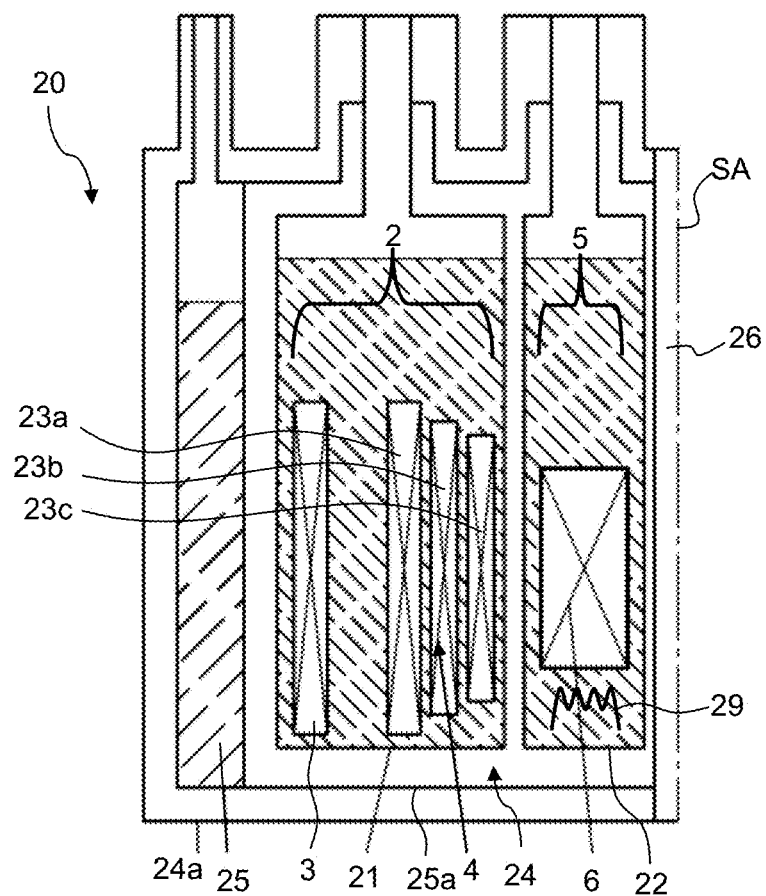
FIG. 5 shows a schematic sectional diagram of a cryostat according to the invention in a third embodiment having two completely separate helium tanks without interposed radiation shield.

As shown in FIG. 5 with reference to a schematic section through a cryostat 20 according to the invention, the HTS coil 5 can be accommodated in a separate, second helium tank 22 which is independent of a first helium tank 21 in which the LTS coil 2 is arranged.

In the embodiment shown, the LTS coil (the LTS portion) 2 comprises an LTS shield section 3 made from NbTi wire and an LTS main section 4 with three sub-coil sections 23a, 23b, 23c, of which the outermost is made from NbTi wire and the two inner 23b, 23c from Nb$_3$Sn wire. Here, both helium tanks 21, 22 are in each case designed with a neck tube for filling with helium and, in the case of the first tank 21, also for the external current feed lines (not shown in more detail). The second helium tank 22 is provided with an electrical heater 29. In the state of normal operation shown, both helium tanks 21, 22 are filled with liquid helium at 4.2 K; it is to be noted that, during charging, the second helium tank 22 and the HTS coil 5 respectively must be temporarily brought to a warm state while the helium thereof is in gaseous form (or is not present) in the second helium tank 22.

Both helium tanks 21, 22 are arranged in a vacuum container 24; here the walls 24a thereof simultaneously form the outer wall of the cryostat 20. Furthermore, a radiation shield 25a, which is cooled by liquid nitrogen (LN$_2$) in an outer tank 25, is provided; the helium tanks 21, 22 are also located inside this radiation shield 25a. For simplification, a boundary of the radiation shield 25a with the room temperature bore 26 is not shown in more detail here.

In the embodiment of FIG. 5 shown, the helium tanks 21, 22 are arranged closely next to one another (without a radiation shield) in order to fill the space near the room temperature bore 26 to a maximum with coils.

Figure 6:
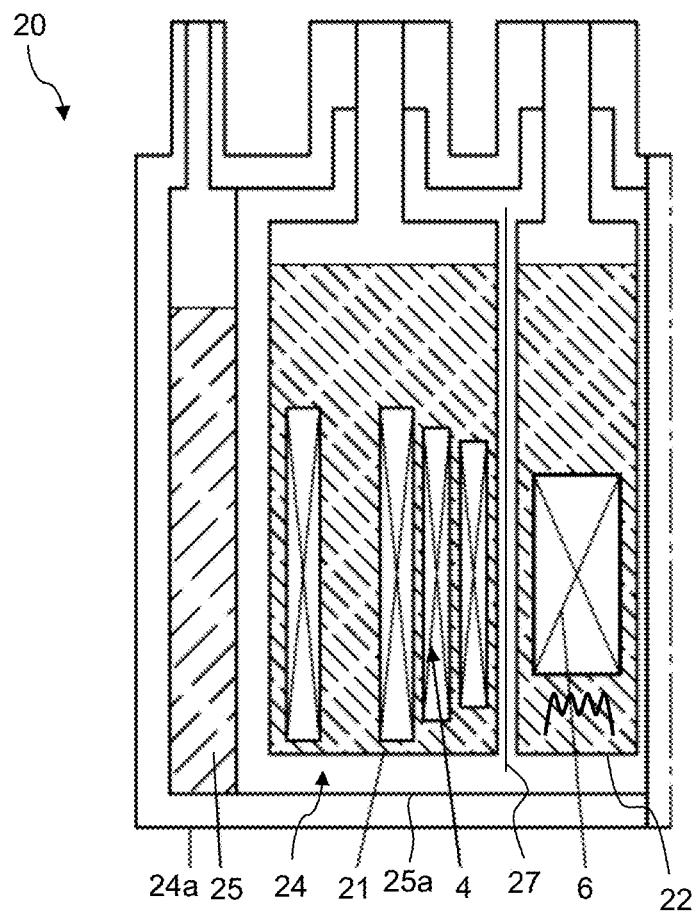
FIG. 6 shows a schematic sectional diagram of a cryostat according to the invention in a fourth embodiment having two completely separate helium tanks with interposed radiation shield.

In an alternative embodiment, which is shown in FIG. 6 and corresponds substantially to the embodiment of FIG. 5, an additional radiation shield 27 is arranged between the helium tanks 21, 22 in the vacuum container 24. In the simplest case (and preferred), this is not thermally coupled to the walls of the radiation shield 25a (and also not otherwise thermally coupled to the structures of the cryostat 20); in this case, a mean temperature between first and second helium tank 21, 22 is established on the radiation shield 27 and, due to radiation reflection, the heat introduced in the colder helium tank (the first helium tank 21 when charging) is approximately halved compared with the case without radiation shield 27. Alternatively, the radiation shield 27 is thermally coupled to the radiation shield 25a by means of suitable metallic connections and accordingly is at the temperature of the liquid nitrogen in the outer tank 25 at approx. 77 K.

Figure 7:
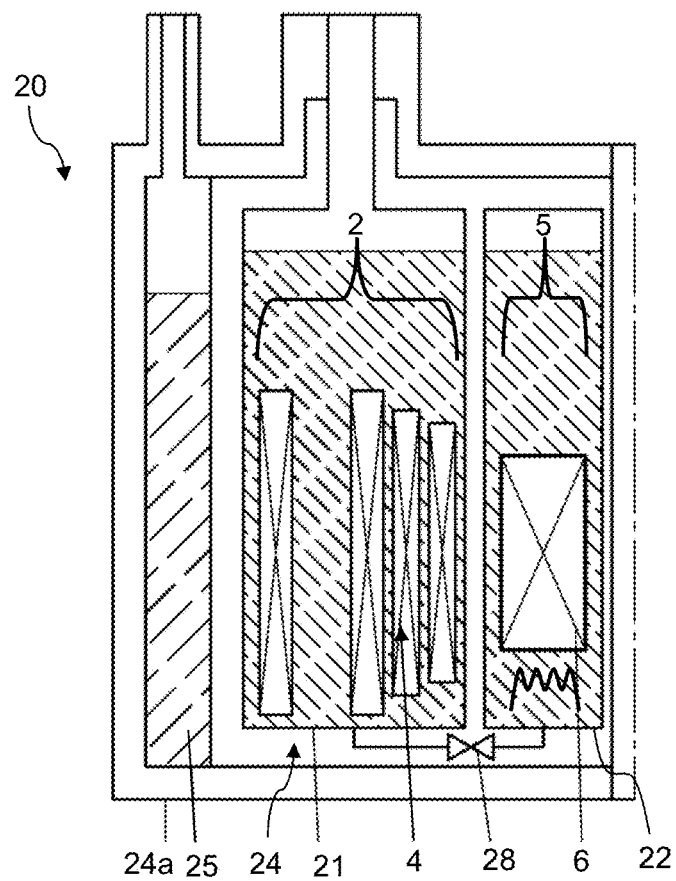
FIG. 7 shows a schematic sectional diagram of a cryostat according to the invention in a fifth embodiment having two helium tanks which are connected to one another by means of an overflow valve.

Furthermore, as shown in FIG. 7, with a cryostat 20 similar to that shown in FIG. 5, the HTS coil 5 can also be arranged in a second helium tank 22 which can be connected by means of a valve 28 to the first helium tank 21 in which the LTS coil 5 is arranged. This enables the second helium tank 22 to be filled with liquid helium from the first helium tank 21 ("overflow valve"). It is advantageous in this case to provide the second helium tank 22 of the HTS coil 5 with a line via which helium can be pumped out (not shown in more detail). In this case, the second helium tank 22 does not require a neck tube, as shown in FIG. 7.

Figure 8:
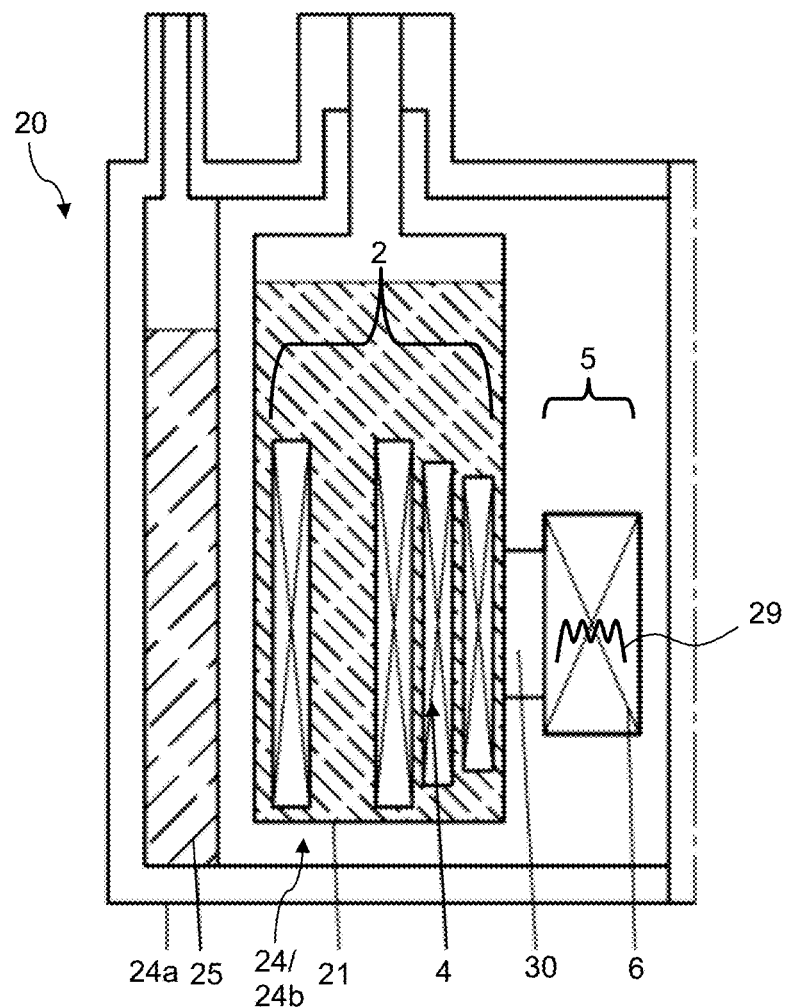
FIG. 8 shows a schematic sectional diagram of a cryostat according to the invention in a sixth embodiment having a heat switch.

In an embodiment of a cryostat 20 of FIG. 8, which is similar to the embodiment of FIG. 5, the HTS coil 5 is arranged in the vacuum chamber 24b of the vacuum container 24. The HTS coil 5 can be coupled to the helium tank 21 of the LTS portion 2 or disconnected from the helium tank 21 by means of a heat switch 30 ("heat switch"), e.g., a gas gap heat switch.

HTS Coils

Preferably, HTS material—especially YBCO—is deposited in an annular form on cylindrical substrate material ("support body") by means of thin film deposition to produce an HTS coil or HTS section. Hastelloy is preferably used as the substrate material. With the help of laser structuring, an initially continuous, deposited HTS cylindrical sleeve can be divided into a plurality of coaxial adjacent rings. The fabrication of "coils" (actually a collection of rings) can also be carried out in several layers (i.e., a plurality of coaxial rings or ring layers with increasing radii are produced). At the same time, $SrTiO_3$ is preferably used as an insulator radially between the rings or ring layers.

A coil produced in this manner can also be used for constructing a high-field NMR magnet. As the HTS rings are continuous, there is no need to produce superconducting connections between HTS conductors. The HTS rings can be formed geometrically such that they are sufficiently thin to not negatively affect the homogeneity of the magnetic field (equivalent to filamentation in NbTi or $Nb_3Sn$ wires).

An HTS coil manufactured as described above is not connected electrically in series with the background magnet (consisting of main and shield coil) made from LTS; there is therefore no need to produce superconducting HTS-LTS connections. Likewise, there is no need to bring out an HTS tape conductor in a complicated manner from the region of the highest magnetic field.

Figure 9:
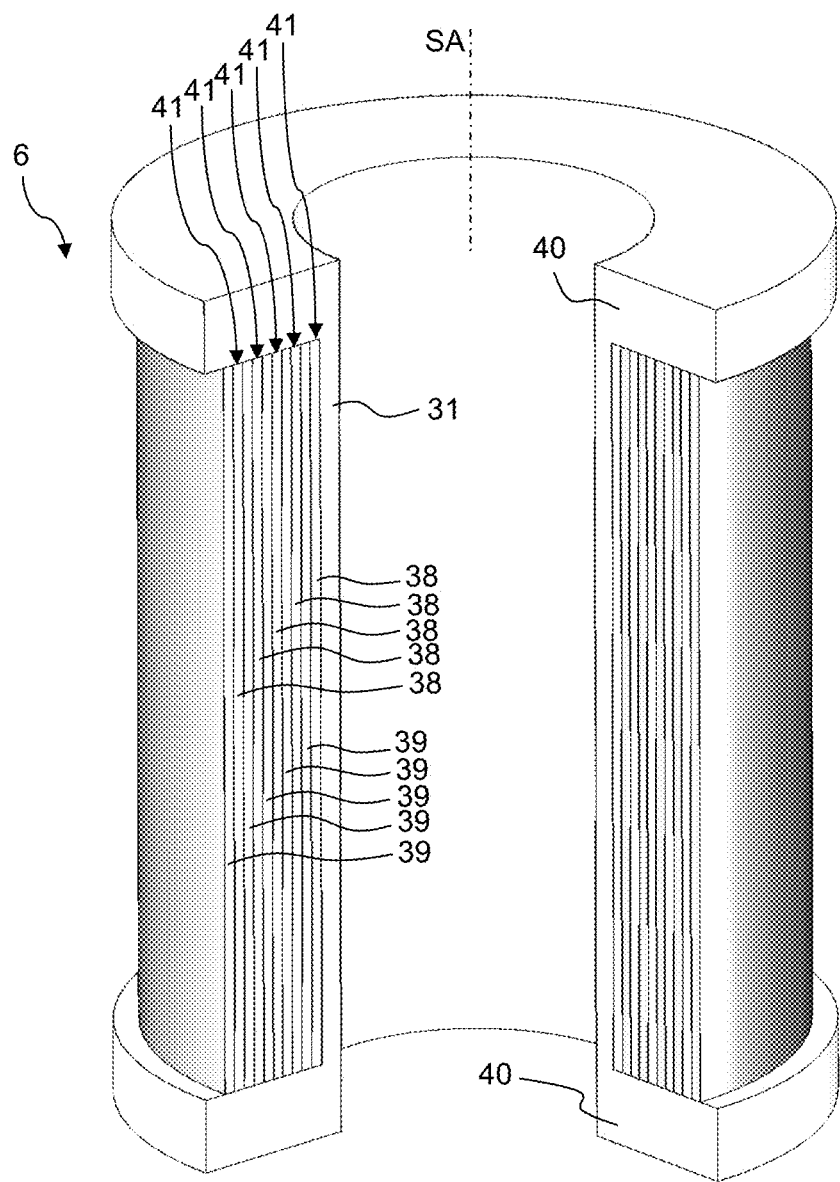
FIG. 9 shows a schematic, partially sectioned diagram of an HTS section for the invention having a cylindrical support body on which a plurality of HTS cylinder sleeves are deposited radially on top of one another.

FIG. 9 shows an HTS section 6 for the invention, wherein a total of five closed cylindrical sleeves 38 made from HTS material, here YBCO, are deposited radially on top of one another on a cylindrical support body 31. The HTS section 6 therefore has HTS material in five radial layers 41. An electrical insulation layer 39, here made of strontium titanate ($SrTiO_3$), is deposited in each case between the cylindrical sleeves 38 and also externally on the outermost cylindrical sleeve 38. The support body 31 has a circular cross section and here is provided on the face ends with end disks 40 which project radially over the cylindrical sleeves 38 and the insulation layers 39.

Figure 10:
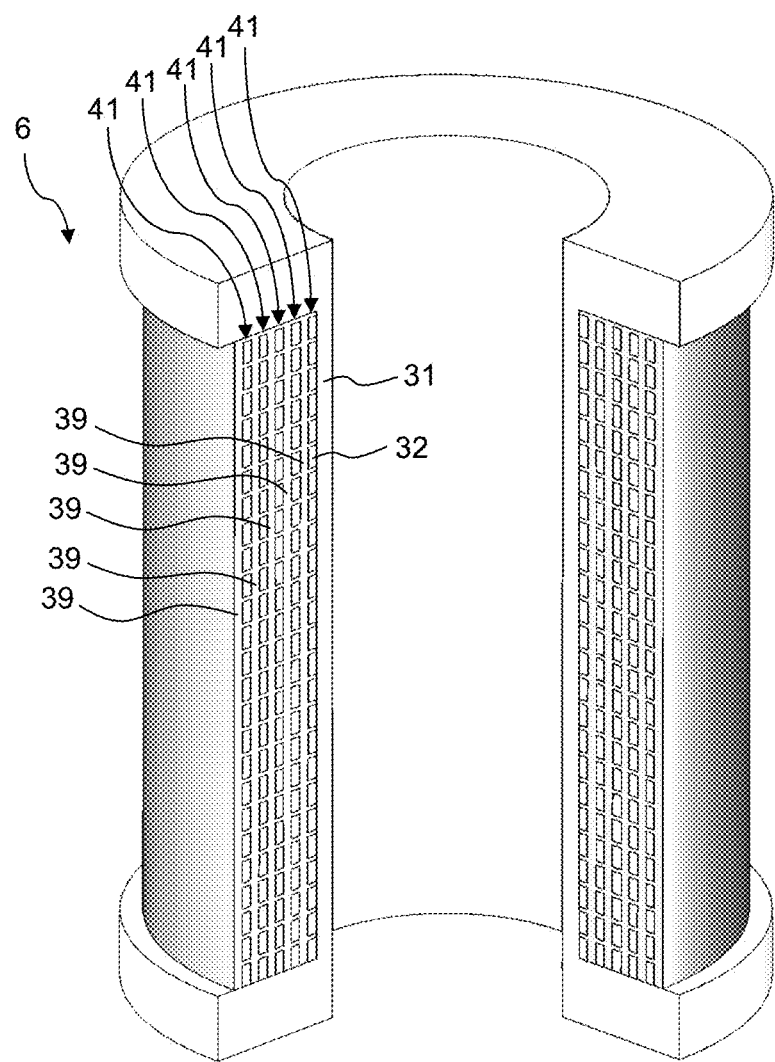
FIG. 10 shows a schematic, partially sectioned diagram of an HTS section for the invention having a cylindrical support body on which a plurality of radial layers of HTS rings are deposited.

A further HTS section 6 for the invention, similar to the HTS section of FIG. 9, is shown in FIG. 10. Here, five radial layers 41, each having a multiplicity (here twenty-five) of superconducting rings 32 which are closed in themselves, are arranged on the cylindrical support body 31. An insulation layer 39, here strontium titanate, is in each case arranged between the radial layers 41 and also on the outermost layer 41. The insulation material is likewise arranged axially between the rings 32 of a respective layer 41.

Alternatively, HTS coils or HTS sections can also be produced based on HTS tape conductors. The HTS tape conductor typically comprises a tape-like, metallic substrate (e.g. a sheet steel tape), on which one or more buffer layers (e.g. made from MgO), an HTS layer (e.g. made from YBCO) and, if necessary, shunt and/or protective layers (usually made of Cu or noble metals such as Ag, Au) are deposited.

Figure 11:
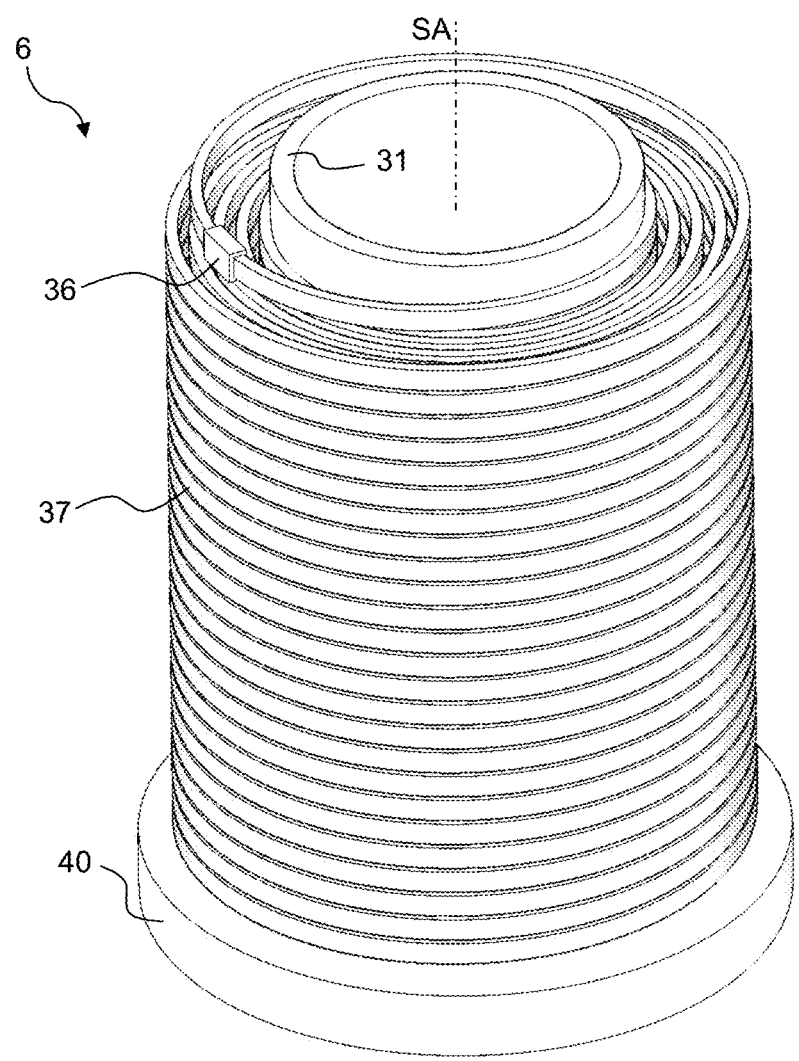
FIG. 11 shows a schematic diagram of an HTS section for the invention having HTS tape wound in the form of a solenoid and having an HTS-HTS joint which is superconductingly short-circuited.

FIG. 11 shows an HTS section 6 for the invention which is wound with a tape conductor 37 on a cylindrical support body (coil body) 31 in the form of a solenoid. Here, a plurality of layers is wound continuously with the tape conductor 37. The innermost layer and the outermost layer are connected to one another by means of an HTS-HTS joint 36 at a coil end (in FIG. 11, the top end), so that the HTS section 6 is superconductingly short-circuited overall. End disks 40, which project radially over the wound tape conductor 37, are provided at the face ends of the support body 31 (however, in FIG. 11, the top end disk is not shown for better clarity).

Figure 12:
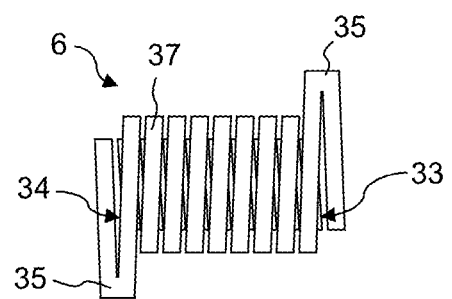
FIG. 12 shows a schematic diagram of an HTS section for the invention having HTS tape wound in the form of a solenoid and superconductingly short-circuited made from a slotted tape conductor.

FIG. 12 shows an HTS section 6 for the invention in which, with the exception of its two ends 35, a slotted HTS tape conductor 37 has been used. An inner layer 33 of the HTS section 6 has been wound in the form of a solenoid with one half ("half tape") of the tape conductor 37 and an outer layer 34 has been wound with the other half of the tape conductor 37; in other embodiments, further coil layers can also be wound with the half tapes. The half tapes connect at the ends 35 without the need for a joint. Methods for winding such an HTS section or HTS coil are described for example in DE 10 2011 082 652 A1.

LIST OF REFERENCES

1 Magnet arrangement
2 LTS portion (background magnet, LTS coil)
3 LTS shield section (shield coil)
4 LTS main section (main coil)
5 HTS portion (HTS coil)
6 HTS section
7 Test volume
8 Superconducting switch (main switch)
9 Power supply
11 First LTS section
12 Second LTS section
13 Power supply
14a, 14b Superconducting switches
20 Cryostat 21 First helium tank
22 Second helium tank
23a-23c Sub-coil sections
24 Vacuum tank (vacuum container)
24a Wall of vacuum tank
24b Vacuum chamber
25 Outer tank for liquid nitrogen ($LN_2$)
25a Radiation shield of outer tank for liquid nitrogen
26 Room temperature bore
27 Radiation shield between helium tanks
28 Valve
29 Electrical heater
30 Heat switch
31 Cylindrical support body (coil support)
32 Ring made from HTS material
33 Inner layer
34 Outer layer
35 End of slotted HTS tape conductor
36 HTS-HTS joint
37 HTS tape conductor
38 HTS cylindrical sleeve
39 Insulation layer
40 End disk
41 Radial layer
B0 Magnetic field in the test volume in the direction of the coil axis
$I_{B^1}$ First operating current
$I_{B^2}$ Second operating current
$I_{IN}$ Interim current
$I_{LTS^1}$ Current in the at least one first LTS section
$I_{LTS^2}$ Current in the at least one second LTS section
SA Coil axis
t0-t4 Times
T1, T2, T3 Current feed lines (charging connections)
$T_{HTS}$ Temperature of HTS portion
$T_{c,HTS}$ Transition temperature of HTS portion
$T_{LTS}$ Temperature of LTS portion
$T_{c,LTS}$ Transition temperature of LTS portion

The invention claimed is:

1. A cryostat having a magnet arrangement for the generation of a magnetic field B0, wherein the magnet arrangement comprises:
    a low-temperature superconductor (LTS) portion having at least one LTS section made from a conventional low-temperature superconductor; and
    a high-temperature superconductor (HTS) portion having at least one HTS section made from a high-temperature superconductor and being arranged radially within the LTS portion, wherein the cryostat is designed to control the temperature of the LTS portion and the HTS portion independently of each other, and wherein the HTS portion is electrically isolated from the LTS portion and is configured to allow it to be superconductingly short-circuited.

2. The cryostat according to claim 1, wherein the HTS portion has no current feed lines.

3. The cryostat according to claim 1, wherein the LTS portion can be short-circuited by means of one or more superconducting switches.

4. The cryostat according claim 1, wherein the at least one HTS section comprises a closed superconducting cylindrical sleeve or one or more closed superconducting rings in a radial layer.

5. The cryostat according to claim 4, wherein said radial layer is deposited on a cylindrical support body.

6. The cryostat according to claim 1, wherein at least one HTS section comprises a coil section which is wound in the form of a solenoid with a tape conductor and is superconductingly short-circuited.

7. The cryostat according to claim 1, wherein the LTS portion comprises at least two LTS sections, including an LTS main section and an LTS shield section.

8. The cryostat according to claim 7, wherein the magnet arrangement has a plurality of charging connections with which the at least two LTS sections can be charged with electrical current and discharged independently of one another.

9. The cryostat according to claim 7, wherein the at least two LTS sections each generate a different magnetic field characteristic.

10. The cryostat according to claim 1, wherein the cryostat forms a first, outer helium tank for the LTS portion and forms a second, inner helium tank for the HTS portion.

11. The cryostat according to claim 10, further comprising a radiation shield arranged between the first helium tank and the second helium tank.

12. The cryostat according to claim 1, wherein the cryostat forms a helium tank for the LTS portion, wherein the HTS portion is arranged in a vacuum chamber which also contains the helium tank, and wherein the HTS portion can be thermally coupled to and decoupled from the helium tank by means of a heat switch.

13. A method for charging the magnet arrangement of a cryostat according to claim 1, the method comprising:
    a) cooling the LTS portion below a transition temperature $T_{c,LTS}$ and holding the HTS portion above a transition temperature $T_{c,HTS}$;
    b) charging at least a first LTS section to an interim current $I_{IN}$, wherein the interim current $I_{IN}$ differs from a first operating current $I_{B^1}$;
    c) cooling the HTS portion below its transition temperature $T_{c,HTS}$; and
    d) changing a current $I_{LTS^1}$ in at least the first LTS section to the first operating current $I_{B^1}$, as a result of which the HTS portion is inductively charged.

14. The method according to claim 13, wherein, during step (b), the LTS portion overall is charged with the same interim current $I_{IN}$ and, during step (d), the LTS portion overall is changed to the same first operating current $I_{B^1}$.

15. The method according to claim 13, wherein the magnet arrangement has at least two LTS sections and a plurality of charging connections with which the at least two LTS sections can be charged with electrical current and discharged independently of one another, and wherein, in step (b), at least one second LTS section is, in turn, charged to a second operating current $I_{B^2}$, and wherein, in steps (c) and (d), the current $I_{LTS^2}$ of the at least one second LTS section is maintained at the second operating current $I_{B^2}$.

16. The method according to claim 15, wherein the operating currents $I_{B^1}$ and $I_{B^2}$ are different.

17. The method according to claim 13, wherein the at least one first LTS section comprises an LTS shield section of the magnet arrangement, and wherein, in step (b), the interim current $I_{IN}$ has an opposite sign to the first operating current $I_{B^1}$ in step (d).

18. The method according to claim 13, wherein the magnitude of the interim current $I_{IN}$ is greater than the first operating current $I_{B^1}$, and, in step (d), the magnitude of the current $I_{LTS^1}$ is reduced to the first operating current $I_{B^1}$ without changing a sign of the current $I_{LTS^1}$.

19. The method according to claim 13, wherein, after step (c), the LTS portion and the HTS portion are held at substantially the same temperature.

20. The method according to claim 13, wherein the LTS portion is, in turn, superconductingly short-circuited in an additional step (e).

* * * * *